(12) United States Patent
Das et al.

(10) Patent No.: US 7,759,701 B2
(45) Date of Patent: Jul. 20, 2010

(54) SEMICONDUCTOR DEVICE HAVING INTERCONNECTED CONTACT GROUPS

(75) Inventors: Johan Das, Nieuwrode (BE); Wouter Ruythooren, Tildonk (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/240,944

(22) Filed: Sep. 29, 2008

(65) Prior Publication Data
US 2009/0091011 A1   Apr. 9, 2009

Related U.S. Application Data

(63) Continuation of application No. 11/343,243, filed on Jan. 30, 2006, now Pat. No. 7,442,635.

(60) Provisional application No. 60/648,841, filed on Jan. 31, 2005.

(30) Foreign Application Priority Data

Jun. 30, 2005   (EP)   ................... 05447156

(51) Int. Cl.
*H01L 29/00*   (2006.01)
(52) U.S. Cl. ................. 257/194; 257/502; 257/E29.246
(58) Field of Classification Search ................. 257/194, 257/E29.246, 502
See application file for complete search history.

(56) References Cited

U.S. PATENT DOCUMENTS

| | | | |
|---|---|---|---|
| 5,162,258 A | 11/1992 | Lemnios et al. | |
| 5,264,713 A | 11/1993 | Palmour | |
| 5,841,197 A | 11/1998 | Adamic, Jr. | |
| 5,919,713 A | 7/1999 | Ishii et al. | |
| 6,214,639 B1 | 4/2001 | Emori et al. | |
| 6,455,945 B1 | 9/2002 | Ishii et al. | |
| 6,940,144 B2 | 9/2005 | Nakayama | |
| 7,217,988 B2 | 5/2007 | Ahlgren et al. | |
| 2001/0005043 A1 | 6/2001 | Nakanishi et al. | |

(Continued)

FOREIGN PATENT DOCUMENTS

DE   102 38 444 A1   3/2004

(Continued)

OTHER PUBLICATIONS

Sheppard, et al. High power demonstration at 10 GHz with GaN/AlGaN HEMT hybrid amplifiers. Device Research Conference, 2000. Conference Digest. 58th DRC Jun. 19-21, 2000, Piscataway, NJ, USA, IEEE, pp. 37-38. XP010517447.

(Continued)

*Primary Examiner*—Lex Malsawma
(74) *Attorney, Agent, or Firm*—Knobbe Martens Olson & Bear LLP

(57) ABSTRACT

The present invention is related to a method of producing a semiconductor device and the resulting device. The method is suitable in the first place for producing high power devices, such as High Electron Mobility Transistors (HEMT), in particular HEMT-devices with multiples source-gate-drain groups or multiple base bipolar transistors. According to the method, the interconnect between the source contacts is not produced by air bridge structures, but by etching vias through the semiconductor layer directly to the ohmic contacts and applying a contact layer on the backside of the device.

19 Claims, 12 Drawing Sheets

U.S. PATENT DOCUMENTS

| | | |
|---|---|---|
| 2002/0022343 A1 | 2/2002 | Nonaka |
| 2002/0030267 A1 | 3/2002 | Suzuki |
| 2003/0024635 A1 | 2/2003 | Utsunomiya |

FOREIGN PATENT DOCUMENTS

| | | |
|---|---|---|
| EP | 1 255 296 A2 | 11/2002 |
| GB | 2 046 514 A | 11/1980 |
| JP | 01 048423 A | 2/1989 |
| JP | 02 148739 A | 6/1990 |
| JP | 04 116950 | 4/1992 |
| JP | 04 144245 A | 5/1992 |
| WO | WO 2004/109770 A2 | 12/2004 |
| WO | WO 2004/109770 A3 | 12/2004 |

OTHER PUBLICATIONS

European Search Report dated Feb. 6, 2008, for European Application No. EP 06 44 7017 filed Jan. 31, 2006.

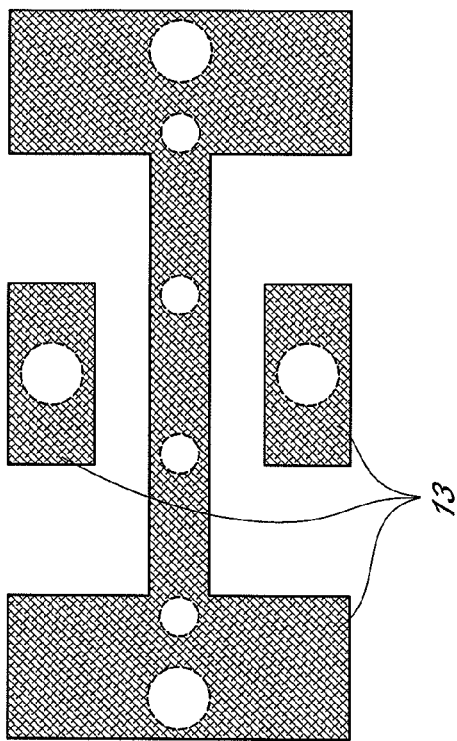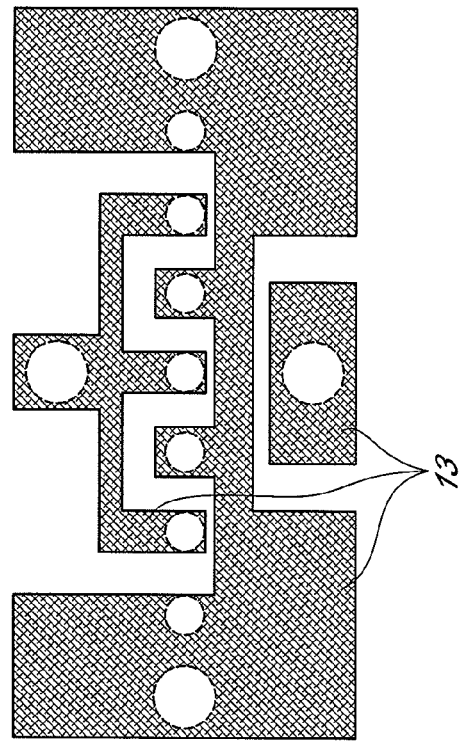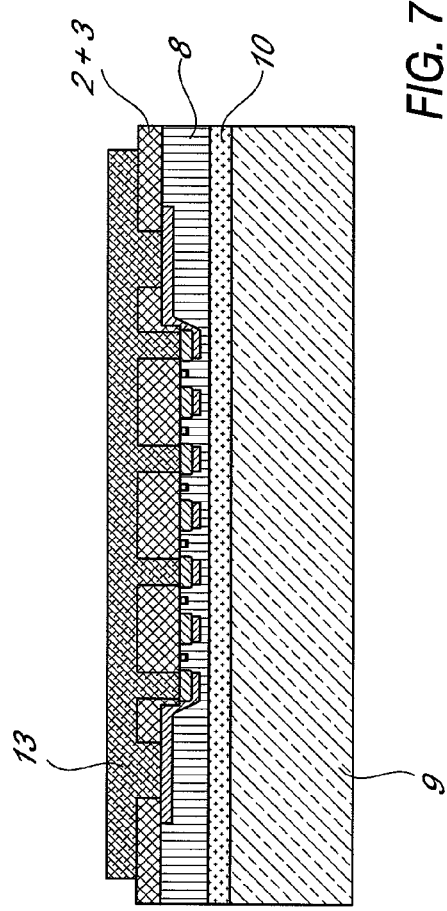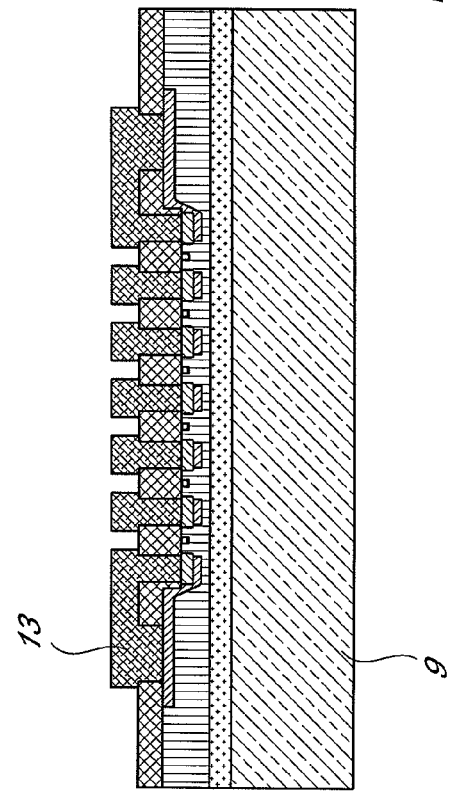
FIG. 7C
FIG. 7D

SEMICONDUCTOR DEVICE HAVING INTERCONNECTED CONTACT GROUPS

RELATED APPLICATIONS

This application is a continuation of U.S. patent application Ser. No. 11/343,243, filed Jan. 30, 2006, for "METHOD FOR PRODUCING A SEMICONDUCTOR DEVICE AND RESULTING DEVICE," issued as U.S. Pat. No. 7,442,635, on Oct. 28, 2008; which application claims the benefit under 35 U.S.C. §119(e) of U.S. Patent Application No. 60/648,841, filed Jan. 31, 2005, for "INTEGRATION OF POWER HEMT'S", and claims the benefit under 35 U.S.C. §119(a) of European Patent Application No. EP 05447156, filed on Jun. 30, 2005, all of which are hereby incorporated by reference.

BACKGROUND OF THE INVENTION

1. Field of the Invention

The present invention is related to semiconductor devices comprising multiple source-gate-drain combinations, in particular devices that are designed to work at high frequency and high power levels, such as multiple gate-finger High Electron Mobility Transistors (HEMTs), i.e. having at least two gate contacts on the same substrate.

2. Description of the Related Art

High frequency and power devices are generally confronted by a problem of thermal management. In HEMT-devices, heat is generated in a very small area, especially in the channel, close to the gate area. This heat needs to be removed in an effective way.

An established way to produce multiple gate-finger HEMTs is to grow a semiconductor stack (e.g. a GaN/AlGaN stack) on a first substrate, for instance a sapphire substrate, provide ohmic contacts, gate metal and contact metal and a passivation layer, and apply a structure on top of the device, called an 'airbridge', to connect the neighbouring contacts, with similar function.

Flip chip bumps are then applied around the HEMT or on a second substrate. The first substrate is then diced to form individual devices which are subsequently attached to the second substrate by flip-chip technology. The air bridges collect the heat generated in the HEMT and remove it laterally. The heat is further removed in vertical direction by the flip-chip bumps. This however results in a device with a considerable height.

In US2003/0040145A1, a method is described for transferring and stacking semiconductor devices. The method allows to produce a single-gate HEMT device by forming it on a first substrate, singulating the first substrate into separate devices, and attaching the individual devices to a second substrate, via a bonding layer. It is not a self-evident step to apply a similar method to multiple gate-finger HEMTs, given that the interconnect between neighbouring contacts would need to be provided in a different way, compared to the air-bridge structures.

US2001/0005043 is related to a semiconductor device and a method of manufacturing the same, wherein a plurality of bipolar transistors are produced on a substrate. The substrate is flipped onto a secondary substrate, and the active areas of the devices are connected through a metal layer applied to the backside of the device, after creation of via holes. The transistors are subsequently diced, to form individual single-gate devices, eg. HEMTs. Given that there is no need in this disclosure for interconnecting corresponding area's (e.g. bases) of the different transistors, to produce a single (e.g. multiple base) device, the problem of avoiding airbridges is not addressed in this document.

Document U.S. Pat. No. 6,214,639 describes a multi-finger HEMT, wherein the source, gate and drain areas are contacted from the backside of the device, by producing through holes to lateral areas which are connected to the multiples sources, drains and gates of the device. However, this technique requires at least one air-bridge to be made. This is shown in FIG. 1a of U.S. Pat. No. 6,214,639, by the dotted lines on the area 14, representing the gate contact area. At these dotted lines, the gate area is crossed by the area's 12. On these locations, air bridges are necessary to separate the contact areas 12 and 14.

Document US2005/0127397 describes a GaN device with heat spreading layer and a thermal via. However, the problem of avoiding airbridges is not addressed here. The heat sinks are moreover not used to interconnect different regions of the device.

One embodiment provides a method for producing semiconductor devices, in particular high frequency and high power devices such as multiple gate-finger HEMTs, which are more compact than the air-bridge structures known in the art, and which are still within the required specifications in terms of heat dissipation.

SUMMARY OF THE INVENTION

The invention is related to a method as described in the appended claims, and to devices produced by applying this method. As expressed in claim 1, the invention is related to a method for producing a semiconductor device comprising a plurality (i.e. at least two) groups of gate/drain/source contacts, or equivalently, base/collector/emitter contacts, wherein the respective types of contact of said groups are interconnected to a common gate, drain and source (or base, collector, emitter) output contact. The preferred embodiments are a multiple gate-finger HEMT, and a multiple base bipolar transistor. In all of the following description, and for the sake of conciseness of the text, the words 'gate, source, drain' contacts will be used. It is however to be noted that these words can be replaced everywhere by 'base, emitter, collector' respectively.

The basic characteristic of the invention is expressed in appended claim 1. A first substrate is provided, comprising on its front side a semiconductor stack, i.e. a semiconductor layer, and on top of that layer a plurality of gate contacts, each gate contact lying in between source and drain ohmic contacts, for producing a plurality of source-gate-drain structures. Possibly but not necessarily after flipping the first substrate onto a second substrate, the device is then contacted from the backside (the side opposite the one carrying the gate/source/drains), by etching via's through the semiconductor layer and through the first substrate itself, in case the first substrate is not removed or in case it is partly removed by a thinning step. According to another embodiment, the first substrate is completely removed after flipping the device onto a second substrate, and vias are etched in the semiconductor layer.

In all embodiments, the vias are etched in a particular way with respect to the above mentioned ohmic contacts. The term 'ohmic contacts' refers to the contact regions which form a direct ohmic contact with the active area's defined as source and drain on the semiconductor layer.

According to the invention, vias are produced directly on top of each ohmic contact of at least one type, e.g. on top of all the source contacts, to thereby expose said ohmic contact, so that it may be contacted by a subsequently applied interconnect layer. At least one type of ohmic contact (e.g. all the source ohmic contacts) is contacted directly in this way. The other type of ohmic contacts may be contacted in another way, e.g. by providing vias to lateral contact areas (i.e. via's which are not directly on top of the actual ohmic contacts). Alternatively, two types of ohmic contact (preferably sources and drains), may all be contacted directly through via holes produced directly on top of these types of contact.

By providing via's directly on top of at least one type of contact, and by thus contacting directly the ohmic contacts of that type, it is not necessary to apply an airbridge in order to accomplish the necessary interconnections. This will be explained in more detail with reference to the drawings.

According to a first embodiment, the method of the invention comprises the following basic steps
- providing a first substrate, comprising on its front side a semiconductor stack, i.e. a semiconductor layer, and on top of that layer a plurality of gate contacts, each gate contact lying in between source and drain contacts (ohmic contacts), for producing a plurality of source-gate-drain structures,
- providing a second substrate provided with an adhesive layer,
- attaching the first substrate to the second substrate, by attaching the front side of that substrate to the adhesive layer on the second substrate. If no additional layers are deposited over the gate contacts, this means that the gate contacts are brought in direct contact with the adhesive layer.
- removing the first substrate from the semiconductor layer, after the step of attaching the first substrate, to expose the backside of the semiconductor layer,
- etching vias through the semiconductor layer, in the way described above,
- producing on the semiconductor layer an interconnecting contact layer to provide an interconnect between said source-gate-drain structures. This results in an operational device on the second substrate.

The last two steps constitute a backside contacting step of the final device, which is the main distinguishing feature compared to the prior art, where the interconnect between the source/gate/drain structures (for multi-gate devices) is established by air-bridge structures. Preferably, a contact metal layer is produced onto said contacts, prior to attaching the first substrate to the second.

The method of the invention is applicable to a multiple gate-finger (in short: multi-finger) HEMT device, which is the preferred embodiment described in detail hereafter. However, the invention is applicable to any plurality of source-gate-drain structures, whether they are adjacent in one area of the substrate, or located in different areas of the substrate.

The first substrate may be a sapphire, silicon or a glass substrate. It may also be a GaAs, Ge, InP, SiC or AlN substrate. The second substrate is preferably a low cost substrate. It may be a glass, silicon or polymer based substrate. According to a further embodiment, the second substrate may be a multi-chip-module dielectric stack (MCM-D). The MCM-D stack may comprise passive components such as resistors or capacitors. The removal of the first substrate can be performed by wet etching, dry etching, laser ablation or laser lift-off (or a combination of these techniques).

The semiconductor layer may be made of a Group III nitride material. A group III nitride material is a material comprising a nitride of an element of Group III of the periodic table of elements. Group III nitride materials are known to a person skilled in the art as wide band gap materials. A group III nitride material can be GaN, whereby GaN is to be understood as a material comprising at least GaN, such as, but not limited hereto, AlGaN, InGaN, AlInGaN, GaAsPN and the like. The semiconductor layer can also comprise a stack of layers, wherein at least one of the layer comprising a group III nitride material. The device as recited in this invention can also comprise a diamond layer instead of a Group-III nitride material.

In another preferred embodiment, the source contact and drain contact are made of an alloy comprising Ti, Al, Ni, Mo, Ta, Pt, Pd, Si, V, Nb, Zr and/or Au. The contact being preferably formed by Ti/Al/Ti/Au sequence, Ti/Al/Ni/Au, Ti/Al/Mo/Au or Ti/Al/Pt/Au.

The adhesive layer is preferably produced from a thermally conductive adhesive, for the purpose of obtaining sufficient heat dissipation in the final device. The adhesive can be selected from the group consisting of organic polymers, SU-8, poly-imide, BCB, silicones, flowable oxides, thermally conductive epoxy, e.g. epoxies with fillers (suspended particles to enhance thermal conductivity). The thickness of the thermally conductive adhesive layer is preferably between 500 nm and 10 μm, even more preferably between 500 nm and 1 μm.

According to a preferred embodiment, a layer with the combined function of passivation and heat spreading, may be deposited on the gate/source/drain contacts on the first substrate, prior to attaching the first substrate to the second.

This passivation and heat spreading layer has two functions:
- to protect gates and exposed semiconductor surface and to improve the electrical properties of said surface,
- to spread the heat in order to minimize the thermal resistance of the adhesive layer This passivation and heat spreading layer is a layer with a high thermal conductivity (higher than 150 W/mK). During the attaching step, it is then the heat spreading layer which is attached to the thermally conductive adhesive layer. In this case, the thermally conductive adhesive layer can be the same as in the previous embodiment. However, since the thermal conductivity of the heat spreading layer is preferably better than typical adhesive layers (<10 W/mK), the application of a heat spreading layer further improves the thermal performance. The passivation and heat spreading layer may be formed of AlN, AlSiC, highly resistive Si, SiC or Si-nitride or diamond. Advantageously, a combination of two subsequent layers, a first layer as a passivation layer and a second as a heat spreading layer, can be used to have an optimal performance.

After via-etching and before backside contacting, a second passivation layer may be applied onto the semiconductor layer.

An advantage of the present invention is that the active side of the semiconductor device is protected and remains essentially unaffected. A further advantage is that the resulting structure is more compact, compared to devices produced by applying air bridge structures. The device produced according to the present invention is highly integrated, has short interconnects and a planar character, allowing further 3D integration.

In a second embodiment, the method comprises a number of further steps, following the steps of the first embodiment. After the connection between the source/gate/drain structures has been established, the second substrate, which is now carrying the finished interconnected device, may be reversed and attached to a third substrate, by attaching the side of the second substrate, carrying the interconnect layer, to the third substrate, preferably an MCM substrate. The second substrate and the original adhesive layer are then removed, and vias can be etched and heat sinks applied which allow for a better heat dissipation. This will be described in more detail for a multi-finger HEMT device.

According to a third embodiment, the first substrate is not attached to a second substrate. The via's are produced through the backside of the first substrate, to expose e.g. the source areas. Possibly, the substrate may be subjected to a thinning operation prior to the via etching. After formation of the via's (in the way described in claim 1), and application of the contacting layer, the first substrate may then be attached to a second substrate (equivalent to the third substrate from the previous embodiment).

To summarize, the advantages of the present invention are:
Additional thermal conduction paths to the active device are created: this means that the heat can be removed both vertically (towards the 2nd substrate, e.g. MCM) and laterally (by means of the metal contacts). The vertical distance between device and substrate is small, which limits the thermal resistance of this conduction path.
Airbridges on the semiconductor substrate are avoided,
The electrical connections to the HEMT are very short; this means that there are less parasitics and as a result an improved RF-behaviour,
The final structure is very planar; this may facilitate further packaging and system integration.

Moreover, the advantages associated with MCM remain valid:
MCM is better suited for greater metal thickness (improving the thermal conductivity)
The devices can be tested before the MCM integration
MCM adds functionality to the device through passives or integration of several active components possibly obtained from different technologies.
Lower substrate cost compared to MMIC.

BRIEF DESCRIPTION OF THE DRAWINGS

FIGS. 7a, 7b, 7c, and 7d further illustrate one embodiment the invention.

DESCRIPTION OF A PREFERRED EMBODIMENT OF THE INVENTION

The preferred embodiment of the present invention concerns the production of a multi-finger HEMT device according to the method as characterised above. In FIG. 1, the different process steps of producing a HEMT according to the first embodiment of the invention, are illustrated. The steps will be further highlighted hereafter.

Figure 1A:
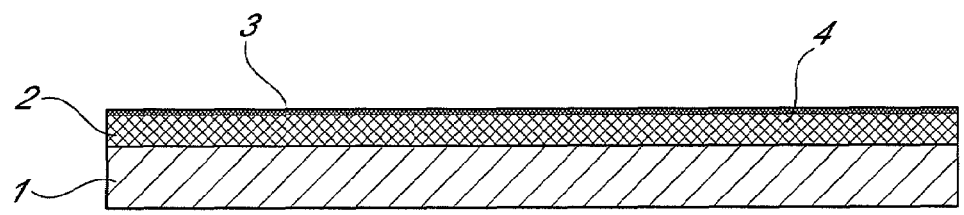
FIG. 1 illustrates the method steps according to a first embodiment of the invention, to produce a multi-finger HEMT.

FIG. 1a: providing a sapphire substrate 1, with a semiconductor stack on top of it. The stack consists of a GaN layer 2 and an AlGaN layer 3. The GaN film is between 1 and 5 μm thick and grown on the sapphire substrate in a MOCVD system (Metal Organic Chemical Vapour Deposition). The top layer 3 of AlGaN (15-30 nm) film is grown on top such that a high concentration of electrons occurs at the interface (two dimensional electron gas, 2-DEG).

Figure 1B:
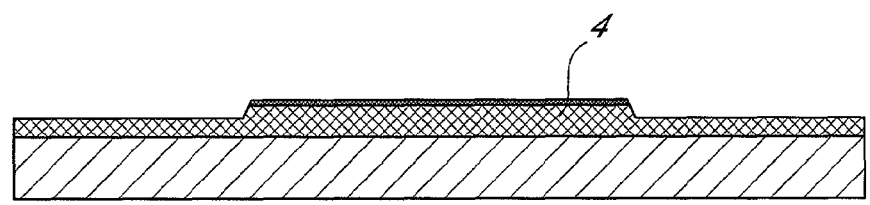

FIG. 1b: a mesa etch is done to isolate individual devices on the substrate. The etch has to go through the 2-DEG interface 4.

Figure 1C:
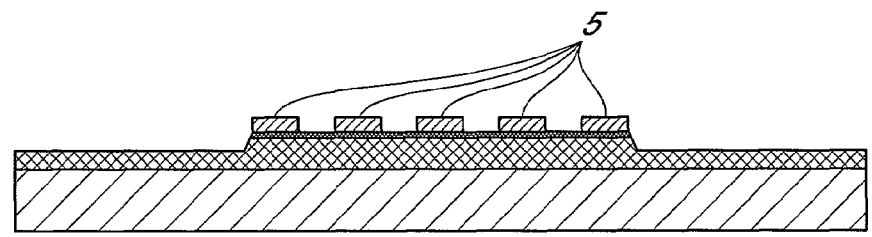

FIG. 1c: A metal stack 5 is deposited for the drain and source contacts. The source and drain contacts are deposited together. A typical stack is Ti/Al/x/Au (x=Mo, Pt, Ti, . . . ), with thickness respectively: 20/40/25/50 nm. The thickness of the layers is optimised depending on the GaN/AlGaN layer. An annealing at high temperature is performed to promote alloy formation that makes the contacts ohmic in nature (at 800-1000° C.).

Figure 1D:
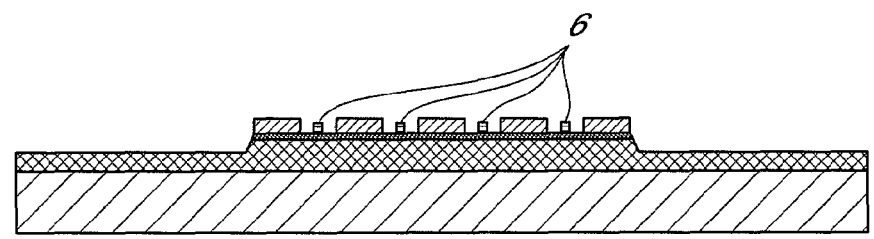

FIG. 1d: The gate contacts 6 are produced with a an e-beam process; the material used for the gates may be Ni/Au or Pt/Au (20/200 nm).

Figure 1E:
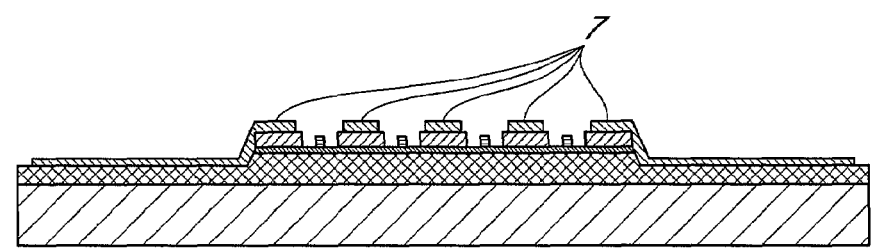

FIG. 1e: optionally, a contact metal layer 7 is applied (e.g TiW/Au/TiW).

Figure 1F:
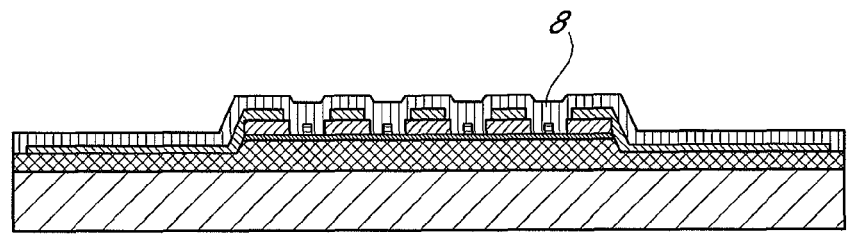

FIG. 1f: a passivation layer is deposited over the device (100 nm Si3N4, not visible on figure) and a heat spreading layer 8 is deposited over the passivation layer (e.g. 0.5-1 μm AlN). After this step, the substrate 1 is preferably diced to form individual devices.

Figure 1G:
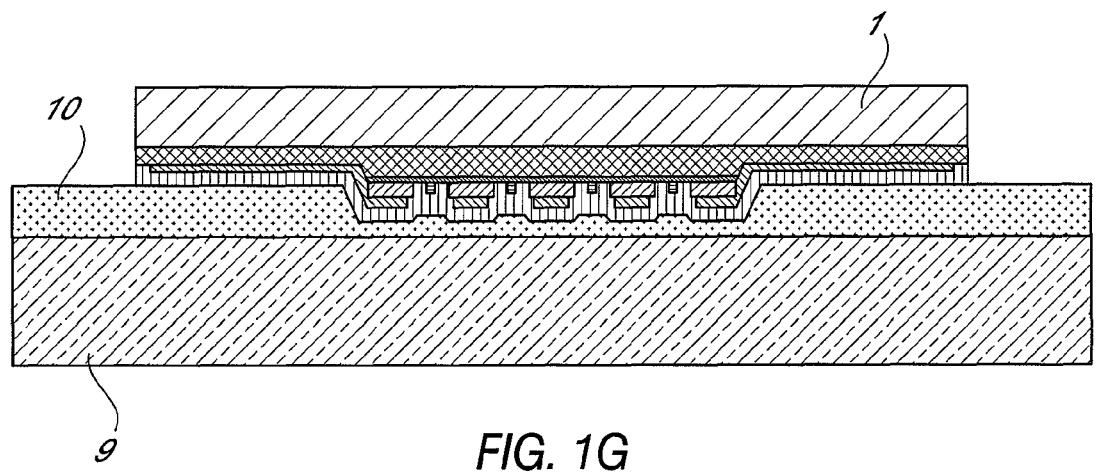

FIG. 1g: a second substrate 9 is provided, with a thermally conductive adhesive layer 10 on said second substrate. There may be passive components present on the second substrate. The HEMT device and first substrate are reversed and bonded to the adhesive layer, so that the heat spreading layer 8 is in direct contact with the adhesive layer 10. The adhesive used may be BCB or SU-8.

Figure 1H:
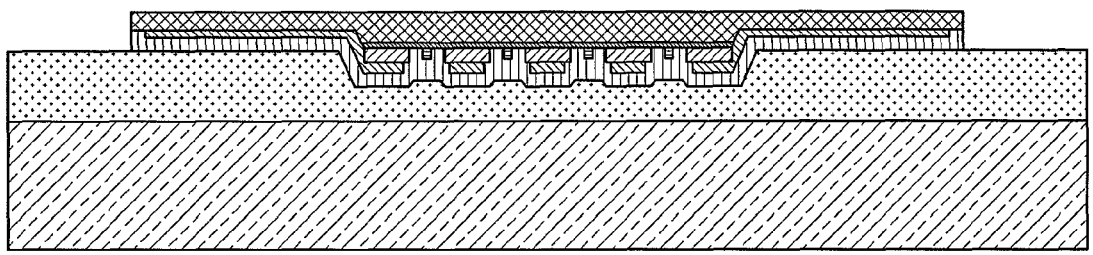

FIG. 1h: the first substrate is removed, possibly using laser lift-off: laser pulses are applied to the sapphire substrate, the pulses having an energy higher than the GaN bandgap. The pulses are absorbed at the GaN/sapphire interface, which leads to a local decomposition into Ga and N2. Ga has a very low melting point: this means that the substrate can be removed at low temperature. The remaining Ga can be removed by a short HCl-dip.

Figure 1I:
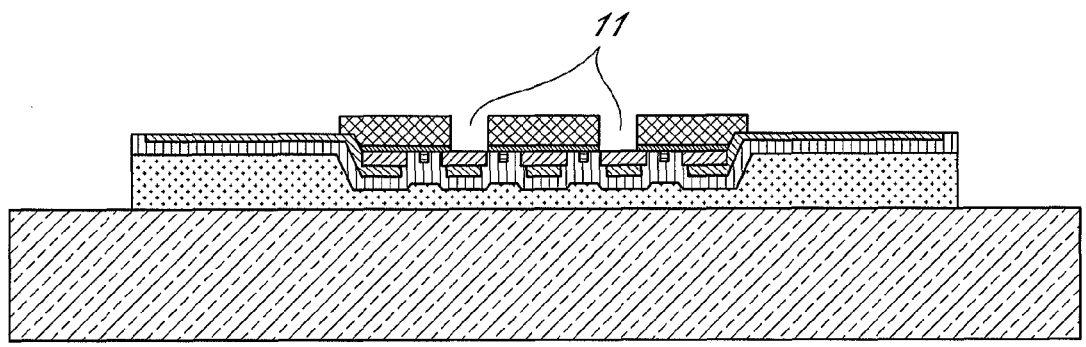

FIG. 1i: Around the HEMT device, the adhesive layer is removed using a SF6/O2 etch. Vias 11 are made in the GaN/AlGaN active layer using Cl2-etching.

In the drawing in FIG. 1i, the vias are etched to expose the source, drain and gate contacts to the environment (i.e. uncover these contacts) so that these source contacts may be directly contacted in the next process step.

Figure 3:
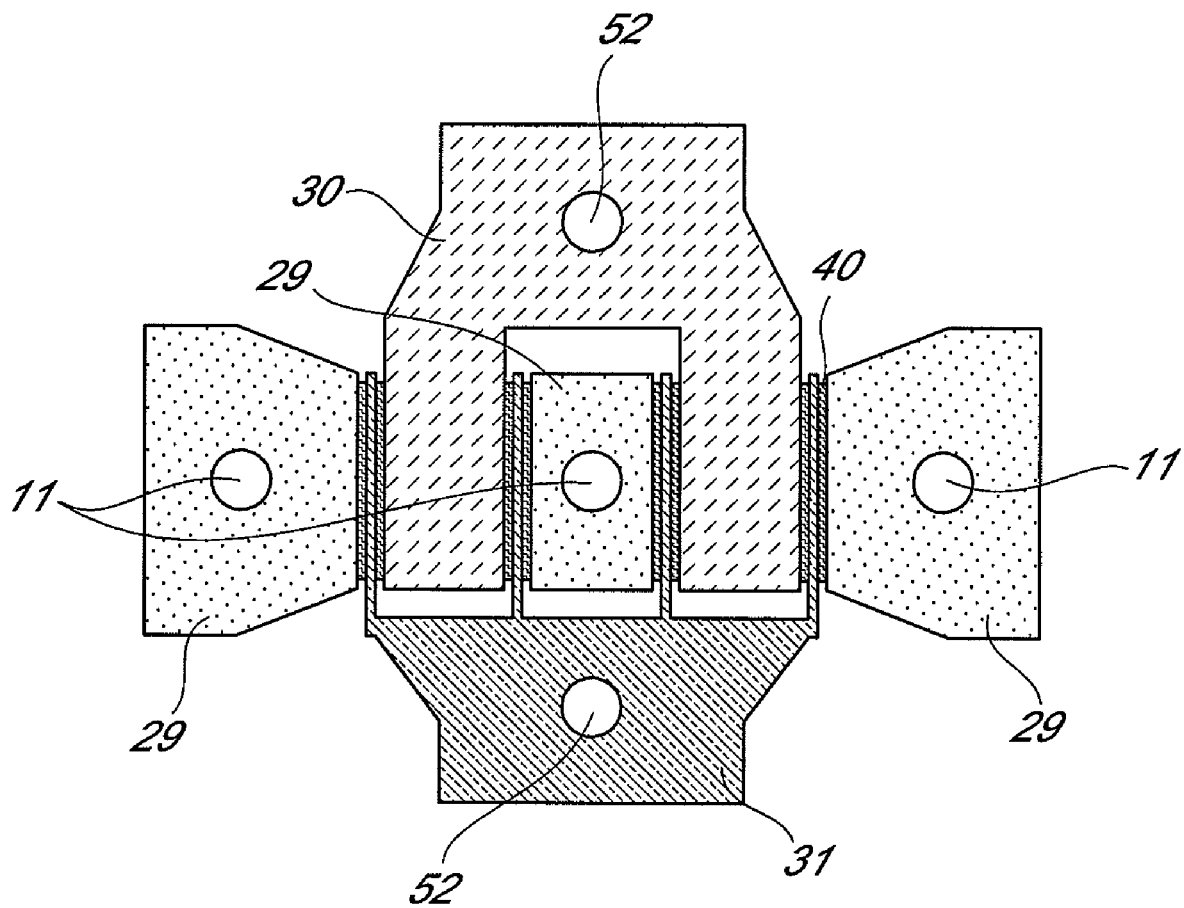
FIG. 3 shows a top view of a HEMT device, illustrating the shape of the contact areas in a preferred embodiment of the device.

The section of FIG. 1i shows vias only to the source contacts. However, the gates and drains need to be contacted as well: FIG. 3 shows a top view of the HEMT device of FIG. 1, including the mesa 40 and the location where the vias 11 are produced. The source contact areas 29 are contacted directly, while the drain and gate areas are produced in such a way that they are interconnected to lateral contact areas 30 and 31, each contacted through one via 52. It is to be noted that it is not a limitation of the invention that the source contacts are to be contacted directly (i.e. as shown in FIG. 3). This may equally be the case for the gate or drain contacts, in which case the remaining two contacts may be contacted through lateral areas in the plane of the device. Still alternatively, all contact areas may be contacted directly, i.e. without the lateral contact areas.

Figure 1J:
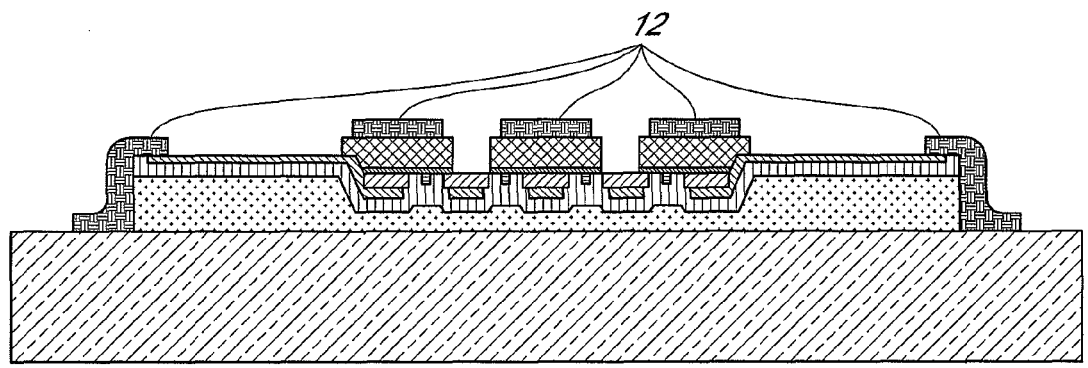

FIG. 1j: optionally, a passivation layer 12 is deposited onto the backside, e.g. Si-nitride. This layer passivates the GaN backside and may influence the electronic properties of the HEMT.

Figure 1K:
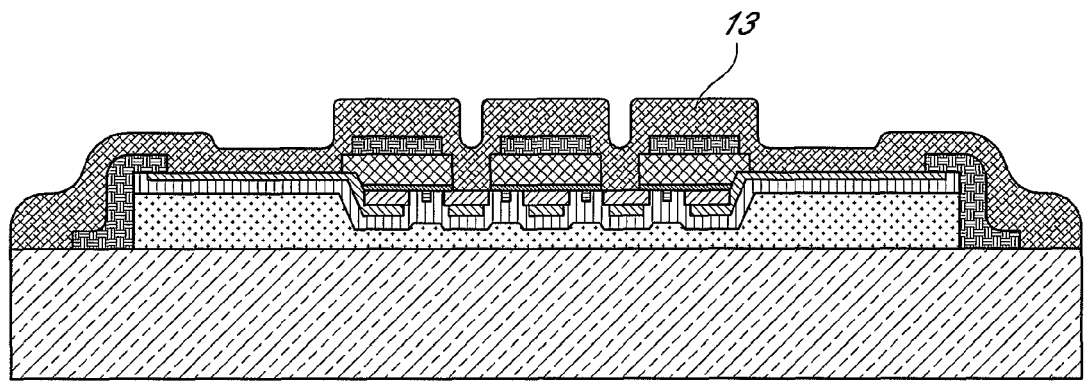

FIG. 1k: a contact layer 13 to the gate/source/drain contacts is deposited, e.g. using Cu-electroplating.

These steps result in a multi-finger HEMT device, produced according to the first embodiment.

Figure 4A:
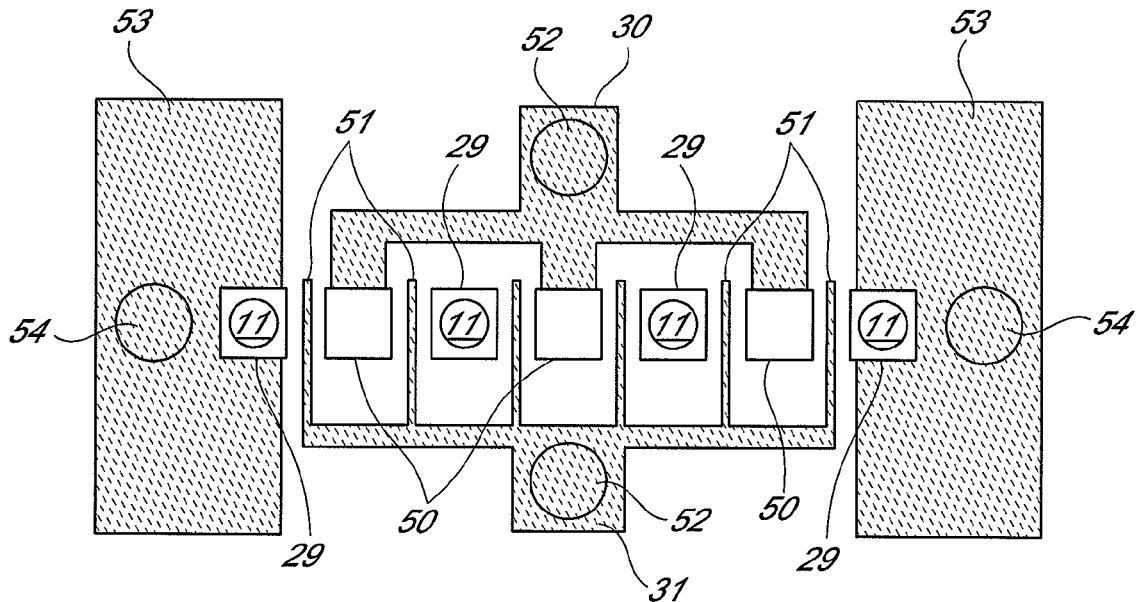
FIGS. 4a and 4b show alternative designs for a 6 gate HEMT according to the invention.
Figure 4B:
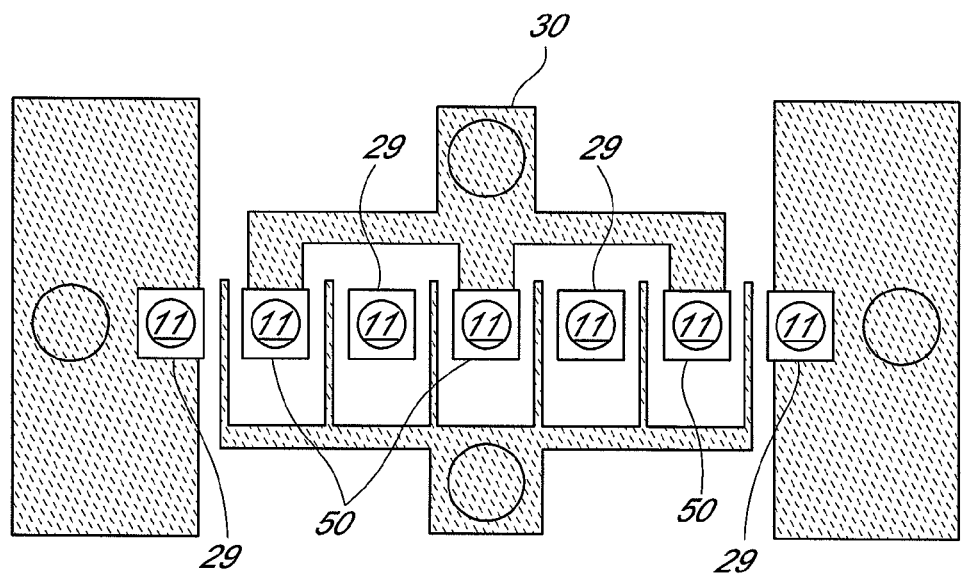

As stated above, the invention is characterized by the fact that vias 11 are produced to directly contact at least one of the types of ohmic contact of the device. FIGS. 4a and 4b show a number of alternatives in case of a 6-gate HEMT. The contours are shown of what is defined as the 'ohmic contacts' of the sources (29) and drains (50). The gate contacts 51 are visible as well. In FIG. 4a, vias 11 are etched directly on top of the source contacts 29, to expose these contacts, so that they may be interconnected by the interconnect layer 13 (FIG. 1). Directly on top of the drain and gate contacts, no vias are produced. In stead, these contacts are contacted via lateral areas 30 and 31 (also called contact pads), wherein one via 52 is produced respectively. In the device of FIG. 4a, contact pads 53 are also shown which are in connection with the outer two source area's. Additional vias 54 may be produced on these outer contact pads. However, the latter is not a requirement of the present invention.

In the embodiment in FIG. 4b, vias 11 are produced to directly contact all the source and drain areas 29 and 50. The contact pad 30 for the drains is still present, but could be omitted in this embodiment. Alternatively, vias 11 may be produced to directly contact all types of contact (sources, drains and gates). In this case, it would be necessary to produce gates with a broader width.

In the embodiments shown in FIGS. 3 and 4, it is clear that the interconnecting layer 13, properly patterned, is able to interconnect the source regions 29 with each other, as well as the drain and gate regions 50,51 respectively, without the necessity of interconnecting one type of contact (e.g. all the drains) by an airbridge. An airbridge would be the necessary if all of the ohmic contact types would be contacted through a lateral contact pad, as in U.S. Pat. No. 6,214,639. This illustrates the improvement accomplished by the invention over the available art.

According to the second embodiment, a number of additional steps are performed, as illustrated in FIG. 2.

Figure 2A:
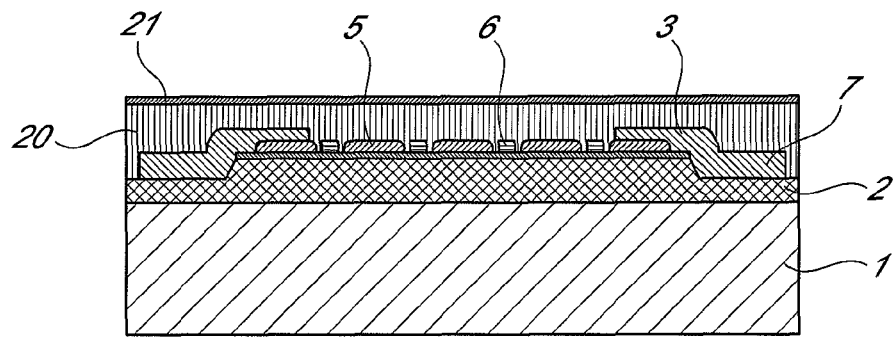
FIG. 2 illustrates the steps of the method according to a second embodiment.

FIG. 2a: The same steps as described above are applied to obtain the gate source and drain contact zones 5 and 6 on the substrate 1. A passivation layer 20 is deposited on the contacts 5 and 6, with an etch stop 21 layer on top of the passivation layer.

Figure 2B:
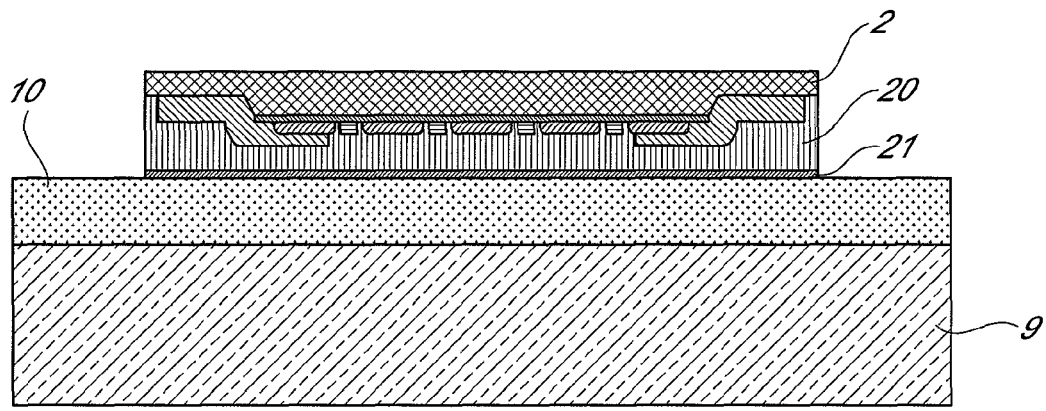

FIG. 2b: the substrate 1 is reversed and bonded to the second substrate 9, after which the first substrate 1 is removed, in the same way as in the first embodiment. The bonding layer 10 according to this embodiment is not necessarily a thermally conductive adhesive layer. It may be SU8/BCB or metal.

Figure 2C:
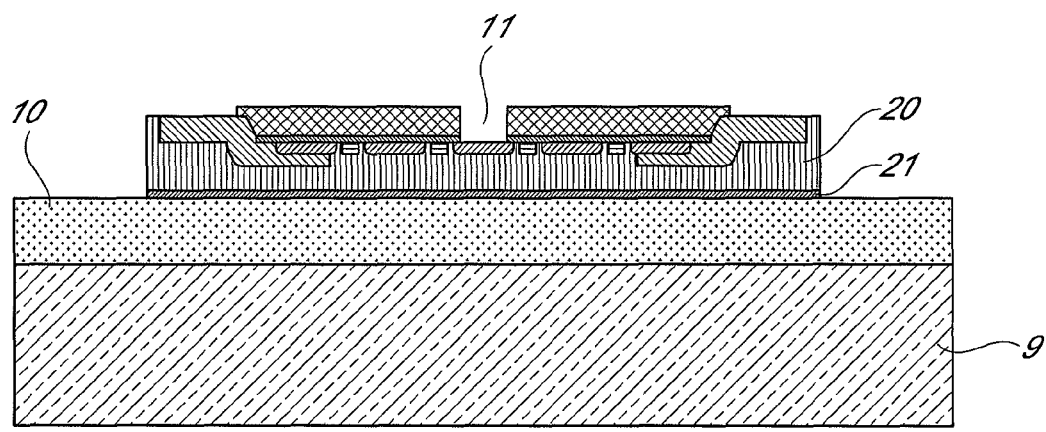

FIG. 2c: vias 11 are etched to the contact areas. In principle, vias to only the source contacts would be enough in this case, but the disadvantage here then is that the devices cannot be measured before bonding to the third substrate. In the preferred case of this embodiment, therefore, vias are produced to all contact areas (source, drain, gate), as in FIG. 3.

Figure 2D:
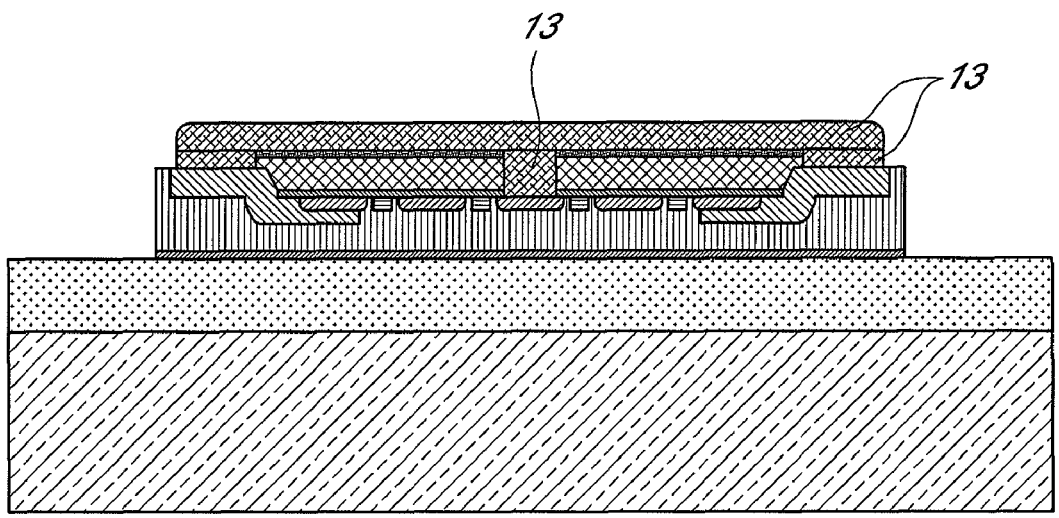

FIG. 2d: the interconnect is established by the backside contact layer 13. The device shown in FIG. 2d therefore corresponds to the finished device from the first embodiment, shown in FIG. 1k, except that in the first embodiment there is a thermal and electrical lateral contact between the backside contact layer 13 and the second substrate 9. This contact is not present in the second embodiment, since the second substrate will be removed anyway (see further).

Figure 2E:
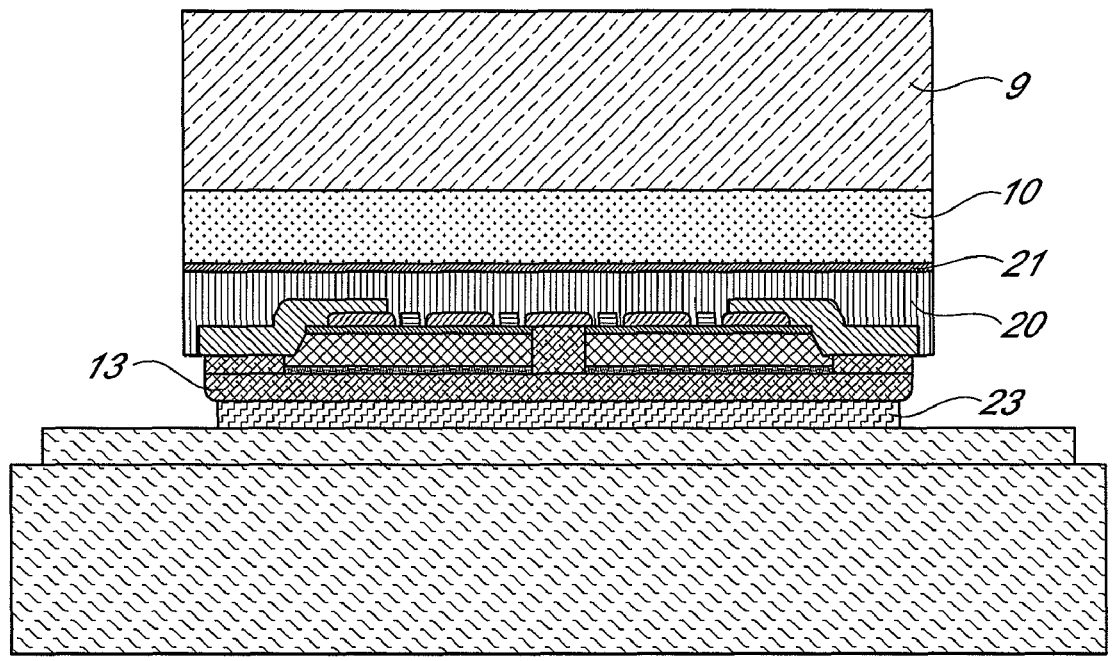

FIG. 2e: according to the second embodiment, a third substrate 22a, 22b is now provided, preferably an MCM-substrate (e.g. an AlN-substrate) with a good thermal conductivity. The bottom layer 22a is the substrate and the layer 22b on top is a patterned metal layer to make contact to the sources. The third substrate is provided with a bonding layer 23. The second substrate is now reversed and attached to the third substrate by attaching the side carrying the interconnect layer 13, to the third substrate, by means of the bonding layer 23. The bonding layer 23 is preferably a layer with good thermal conductivity. It may be a metal bonding layer.

Figure 2F:
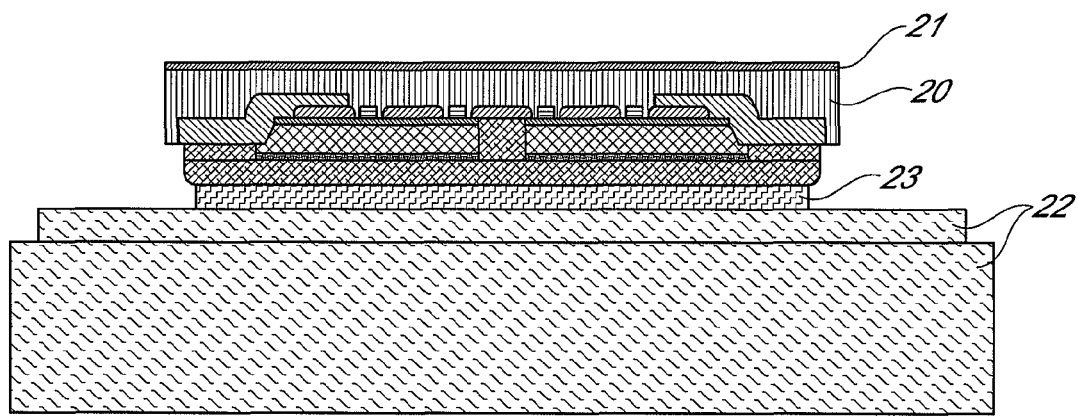

FIG. 2f: The second substrate 9 and adhesive layer 10 are subsequently removed. This may be done by an etching step, stopped by the etch stop layer 21. Other ways of removing the second substrate 9 may however be applied, which would not require an etch stop layer.

Figure 2G:
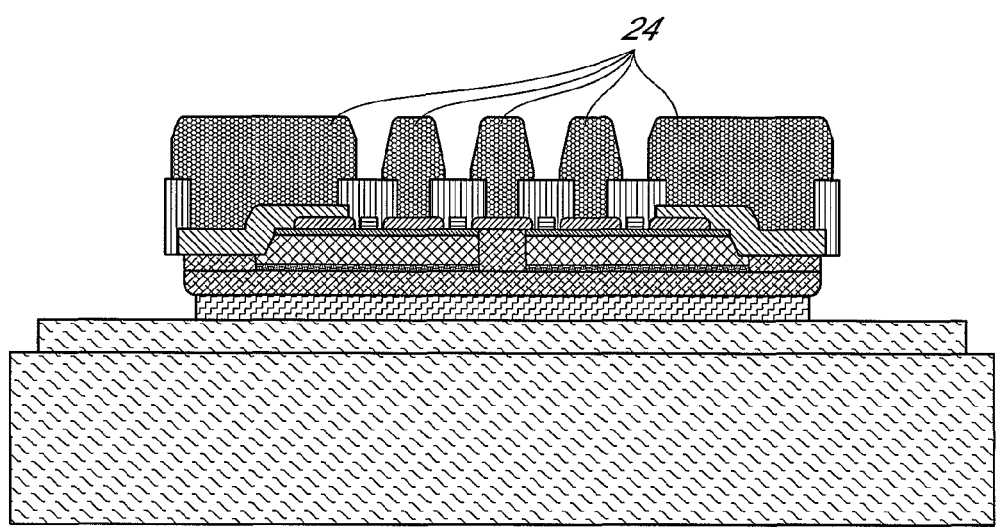

FIG. 2g: the etch stop layer is removed and vias may be etched in the passivation layer 20 on top of the gate/source/drain contacts (5,6), and heat sinks 24 may be deposited on top of the contacts.

Preferably according to the second embodiment, the first substrate 1 is not diced before reversing and attaching it to the second substrate. In stead, the first substrate is reversed and attached as a whole, possibly attaching several HEMT-devices to the second substrate. The dicing is preferably done after reversing and attaching the first substrate to the second. As shown in FIG. 2e, individual devices are then reversed and attached to the third substrate.

The second embodiment of the method of the invention provides some additional advantages over the prior art. Heat removal can be obtained both on the front and the backside of the device. At the back side, the heat can be removed to the third substrate 22 through the adhesive layer 23 and interconnect layer 13, while at the front side, heat sinks can be produced, for further improving the efficiency of the heat removal. With the device produced according to the second embodiment, it is also possible to test the complete device (with source contacts) before the integration of the HEMT in a circuit on the third substrate.

Figure 5A:
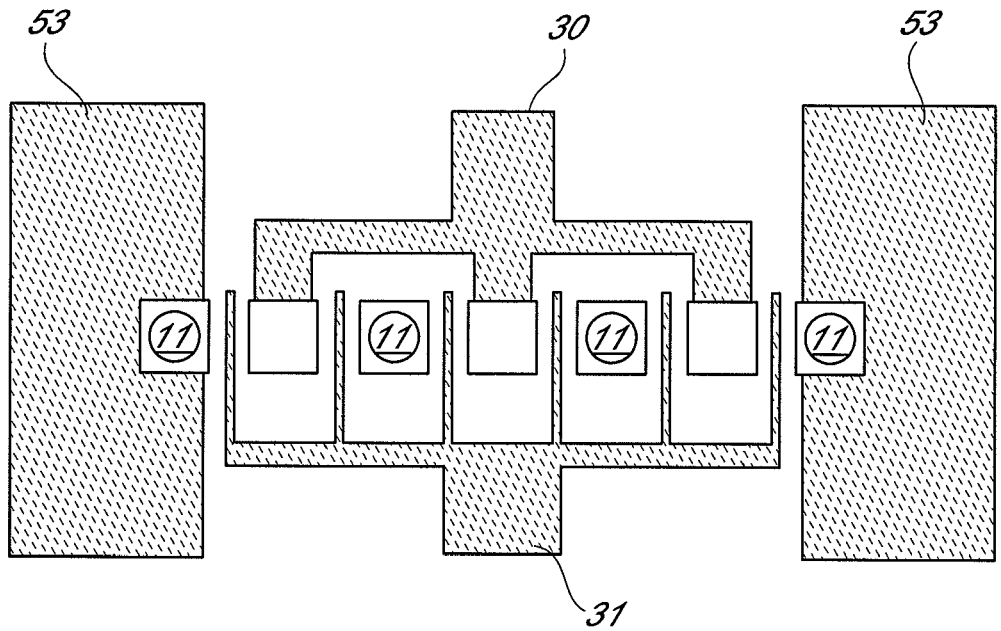
FIGS. 5a and 5b show more alternative designs for a 6-gate HEMT according to the invention.
Figure 5B:
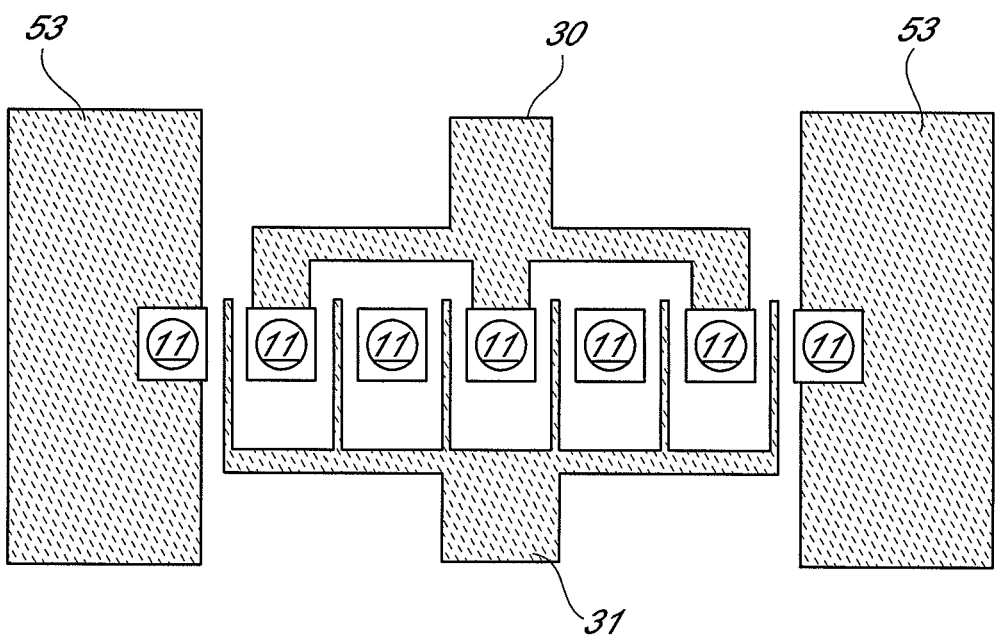

In the second embodiment, it is possible to produce the vias to the ohmic regions in the way shown in FIGS. 5a and 5b, i.e. without producing vias 52 to the lateral contact pads 30 and 31. This is because these areas can be contacted in a known way, and without using air bridges, after the device has been attached to the third substrate.

According to a third embodiment, the first substrate is not flipped onto a second substrate, but the vias are etched through the backside of the first substrate itself, see FIG. 6. This is possible only with a first substrate 1 made of particular materials, preferably a Si. On top of the Si, there is also a further semiconductor layer (2,3), e.g. GaN/AlGaN, as in the previous embodiments. The layer 2+3 is shown as one layer in FIG. 6, but this is preferably a double layer as in FIG. 1. As seen in FIG. 6a, the device, including all the gate/drain/source contacts 7 and the passivation layer 8 is produced on the first substrate, in the same way as described above for embodiment 1. Vias 60 are etched through the passivation layer 8, to contact the lateral contact pads, see FIG. 6b.

Figure 6A:
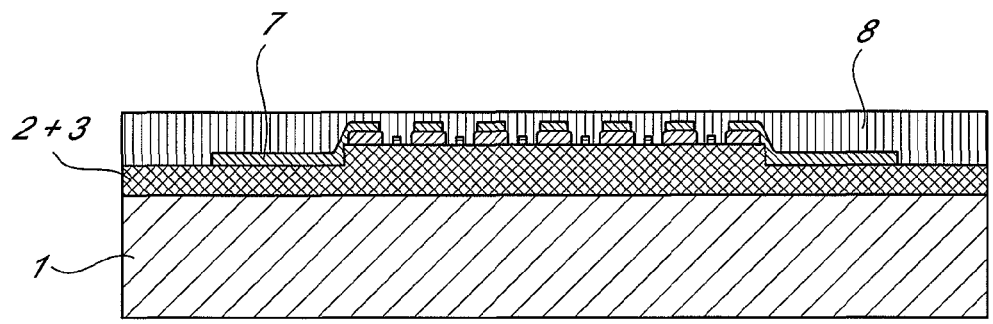
FIGS. 6a, 6b, 6c, and 6d further illustrate one embodiment the invention.
Figure 6B:
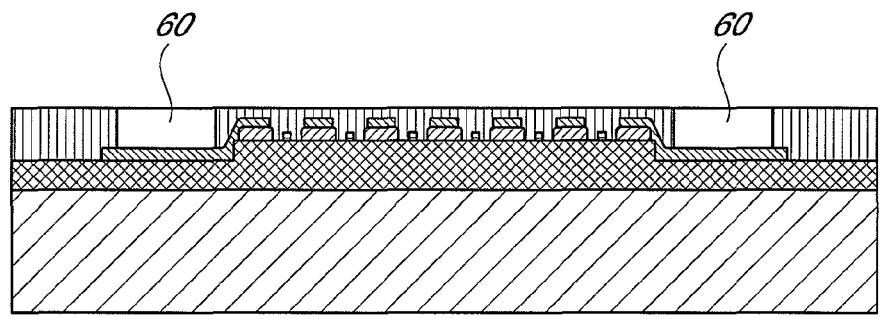
Figure 6C:
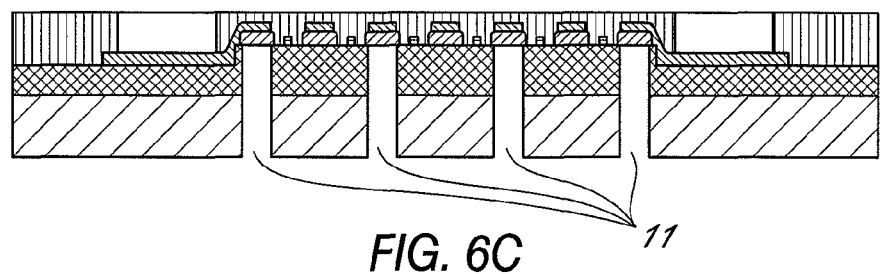
Figure 6D:
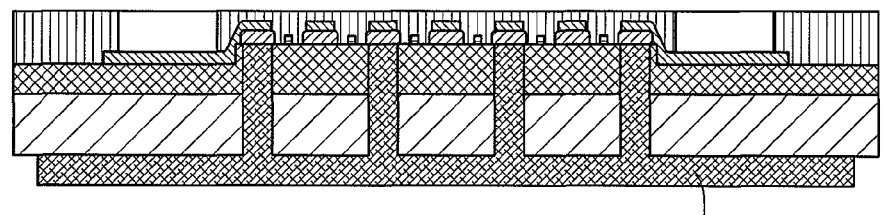

In this embodiment, the vias 11 are produced through the Si-substrate 1 and the semiconductor layer 2,3 (see FIG. 6c). Possibly, the substrate may be thinned at the backside, before producing the vias. This is the case in the embodiment shown: the thickness of the substrate 1 has been reduced in between the views B and C. The thinning may be performed by etching back the substrate, or by grinding and/or polishing the substrate from the backside.

The interconnect layer 13 is applied onto the backside of the substrate, leading to a finished device, see FIG. 6.

As mentioned above, the interconnect layer 13 is to be patterned in a proper way, to allow the ohmic contacts to be interconnected correctly. FIG. 7 shows some examples of how this patterning may be done, in the case of the 6-gate HEMT shown in FIG. 4.

Figure 7A:
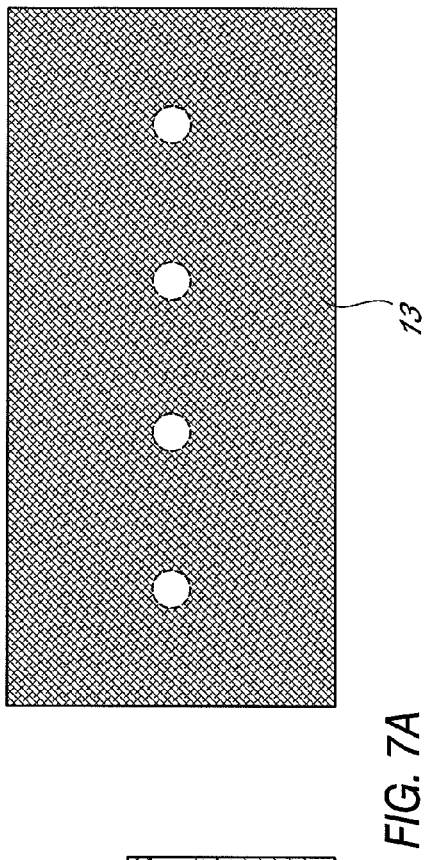
Figure 7B:
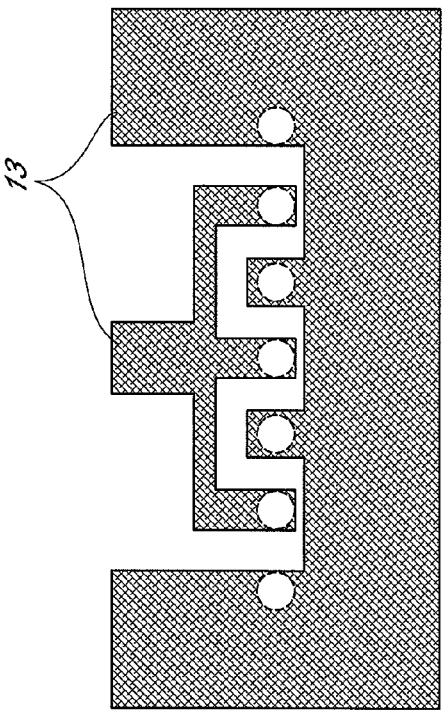

FIGS. 7a and 7b show two possibilities which can be used in a device according to embodiment 1. The interconnect layer 13 shows three distinct regions, and thus allows a common contact to the gates, drains and sources respectively.

FIGS. 7c and 7d show one or two distinct regions on the interconnect layer 13. This design is only usable in embodiment 2, as it requires one or two additional contact layers to be applied to the front of the device, after the device has been attached to the third substrate (FIG. 2).

What is claimed is:

1. A semiconductor device, comprising:
a semiconductor layer;
a plurality of groups of contacts formed on a first side of the semiconductor layer, each group comprising at least three types of contacts, wherein the at least three types of contacts comprise a source contact, a drain contact, and a gate contact, or the at least three types of contacts comprise an emitter contact, a base contact, and a collector contact;
an interconnecting layer formed directly on a second side of the semiconductor layer or directly on a passivation layer applied between the semiconductor layer and the interconnecting layer, the interconnecting layer being configured to provide an interconnect between said groups of contacts; and
a substrate attached to the first side of the semiconductor layer on top of said gate, source, and drain contacts or base, emitter, and collector contacts,
wherein each group comprises at least one gate contact formed between source and drain ohmic contacts, or each group comprises at least one base contact formed between emitter and collector ohmic contacts, and
wherein the semiconductor layer is configured to define a plurality of vias connecting the first side with the second side, said vias being aligned at least with each of at least one type of ohmic contact in said plurality of groups such that said each of the at least one type of ohmic contact are connected by the interconnecting layer.

2. The device of claim 1, wherein respective types of contact in each group are interconnected to a common gate, drain, and source output contact, or a common base, collector, and emitter output contact.

3. The device of claim 1, wherein vias are aligned with all the ohmic contacts of one type, and wherein vias are also aligned with lateral areas to connect to contacts of all other types.

4. The device of claim 1, wherein vias are aligned with all the source or emitter contacts, and wherein vias are also aligned with all the drain or collector contacts.

5. The device of claim 1, further comprising an adhesive layer disposed between the substrate and the semiconductor layer, said adhesive layer comprising a thermally conductive material selected from the group consisting of organic polymers, thermally conductive epoxy, SU-8, poly-imide, BCB, silicones, and flowable oxides.

6. The device of claim 5, wherein the thermally conductive epoxy is an epoxy with fillers.

7. The device of claim 1, further comprising a contact metal layer formed on said gate, source, and drain contacts, or formed on said base, emitter, and collector contacts.

8. The device of claim 7, further comprising a passivation and heat spreading layer formed on said metal contact layer.

9. The device of claim 8, wherein said passivation and heat spreading layer comprises AlN, AlSiC, highly resistive Si, SiC or Si-nitride.

10. The device of claim 1, wherein said semiconductor device is a multiple gate-finger HEMT.

11. The device of claim 1, wherein said semiconductor device is a multiple base bipolar transistor.

12. The device of claim 1, wherein said substrate is diced to form individual devices.

13. The device of claim 1, wherein said semiconductor layer comprises a stack of a GaN layer and an AlGaN layer.

14. The device of claim 1, wherein said semiconductor layer comprises a stack of layers of which at least one layer comprises a group III nitride material.

15. The device of claim 1, further comprising a substrate bonded to the interconnecting layer.

16. A semiconductor device, comprising:
a semiconductor layer;
a plurality of groups of contacts formed on a first side of the semiconductor layer, each group comprising at least three types of contacts, wherein the at least three types of contacts comprise a source contact, a drain contact, and a gate contact, or the at least three types of contacts comprise an emitter contact, a base contact, and a collector contact;
an interconnecting layer formed directly on a second side of the semiconductor layer or directly on a passivation layer applied between the semiconductor layer and the interconnecting layer, the interconnecting layer being configured to provide an interconnect between said groups of contacts; and
a substrate bonded to said interconnecting layer,
wherein each group comprises at least one gate contact formed between source and drain ohmic contacts, or each group comprises at least one base contact formed between emitter and collector ohmic contacts, and
wherein the semiconductor layer is configured to define a plurality of vias connecting the first side with the second side, said vias being aligned at least with each of at least one type of ohmic contact in said plurality of groups such that said each of the at least one type of ohmic contact are connected by the interconnecting layer.

17. The device of claim 16, further comprising a patterned metal layer attached to said interconnecting layer, said patterned metal layer configured to provide connection to at least certain ones of the contacts, wherein said substrate is bonded to said interconnecting layer over said patterned metal layer.

18. The device of claim 16, further comprising heat sinks formed on top of said source, gate and drain contacts, or on top of said emitter, base, and collector contacts.

19. The device of claim 16, wherein said vias are aligned with only one type of contact.

* * * * *